United States Patent [19]
Chen

[11] Patent Number: 6,078,195
[45] Date of Patent: *Jun. 20, 2000

[54] LOGIC BLOCKS WITH MIXED LOW AND REGULAR $V_T$ MOSFET DEVICES FOR VLSI DESIGN IN THE DEEP SUB-MICRON REGIME

[75] Inventor: Wei Chen, Croton-on-Hudson, N.Y.

[73] Assignee: International Business Machines Corporation, Armonk, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/868,231

[22] Filed: Jun. 3, 1997

[51] Int. Cl.[7] .............................................. H03K 19/0948
[52] U.S. Cl. .............................. 326/121; 326/17; 326/119
[58] Field of Search .............................. 326/17, 112, 119, 326/121, 83, 34, 117, 120

[56] References Cited

U.S. PATENT DOCUMENTS

| | | | |
|---|---|---|---|
| 4,956,691 | 9/1990 | Culley et al. | 326/112 |
| 5,150,186 | 9/1992 | Pinney et al. | 326/112 |
| 5,426,383 | 6/1995 | Kumar | 326/119 |
| 5,629,638 | 5/1997 | Kumar | 326/17 |

OTHER PUBLICATIONS

Y. Taur et al, "CMOS Scaling into the Nanometer Regime", Apr. 1997 Proc. of IEEE, vol. 85 #4, pp. 486–504.

L. Su et al, "A High–Performance 0.08 μm CMOS" 1996 Symposium on VLSI Tech. Digest of Tech. Papers, pp. 12–13 No Month.

R.H.Dennard et al, "Design of Ion–Implanted MOSFET's with Very Small Physical Dimensions" IEEE Jn. of Solid State Circuits V.SC9 #5 Oct. 1974.

B. Davari et al, CMOS Scaling for High Performance and Low Power—The Next Ten Years: Proc. of IEEE, V. 83, #4, Apr. 1995 pp. 595–606.

*Primary Examiner*—Jon Santamauro
*Attorney, Agent, or Firm*—Whitham, Curtis & Whitham; Wayne L. Ellenbogen, Esq.

[57] ABSTRACT

Logic books with mixed low $V_t$ and regular $V_t$ devices provide a performance gain without the large increase in stand-by power of the logic book. Low $V_t$ devices are used to gain speed, and regular $V_t$ devices are used to cut off the off-current of the logic book. The optimization of mixed $V_t$ configurations is important. No single path between an output and ground can be made of all low $V_t$ devices, and no single path between the output and $V_{dd}$ can be made of all low $V_t$ devices. Generally, devices that are connected to $V_{dd}$ and ground should be regular $V_t$ devices, a low $V_t$ devices should be connected closest to the output. All low $V_t$ devices should be appropriately reversely biased in their off states. Because its merits in standby power, speed and noise margin, such mixed-low-and-regular-$V_t$ logic books can have a wide use in VLSI designs (e.g., high performance microprocessor design).

10 Claims, 18 Drawing Sheets

LOGIC BLOCKS WITH MIXED LOW AND REGULAR $V_T$ MOSFET DEVICES FOR VLSI DESIGN IN THE DEEP SUB-MICRON REGIME

BACKGROUND OF THE INVENTION

1. Field of the Invention

The present invention generally relates to logic books for use in very large scale integrated (VLSI) circuit design and, more particularly, to novel technology logic books with mixed low and regular voltage threshold ($V_t$) metal oxide semiconductor field effect transistor (MOSFET) devices in the deep sub-micron regime.

2. Background Description

Speed and power are of utmost concern in deep sub-micron VLSI circuit design. These two competing requirements typically must be resolved with design tradeoffs by the VLSI circuit designer to obtain an optimum design. As the channel lengths of transistors used in VLSI circuits are scaled into the deep submicron regime, typical operating voltage ($V_{dd}$) drops to less than two volts (2V). See for example the following references:

R. H. Dennard, F. H. Gaensslen, H. N. Yu, V. L. Rideout, E. Bassous, and A. R. LeBlanc, *IEEE Journal of Solid-State Circuits*, vol. 9, No. 5, 256 (1974)

B. Davari, R. H. Dennard, and G. G. Shahidi, *Proceedings of the IEEE*, vol. 83, No. 4, 595 (1995)

Y. Taur, D. A. Buchanan, W. Chen, D. J. Frank, K. E. Ismail, S. H. Lo, G. A. Sai-Halasz, R. G. Wiswanathan, H. J. C. Wann, S. J. Wind, and H.

S. Wong, *Proceedings of the IEEE*, Vol. 85, No. 4, 486 (1997)

To keep devices' off-current at a reasonable level, the threshold voltage ($V_t$) is maintained at a level of 300 to 400 millivolts (mV). See L. Su, S. Subbanna, E. Crabbe, P. Agnello, E. Nowak, R. Shulz, S. Rauch, H. Ng, T. Newman, A. Ray, M. Hargrove, A. Acovic, J. Snare, S. Crowder, B. Chen, J. Sun, and B. Davari, 1996 *Symposium on VLSI Technology Digest of Technical Papers*, p. 13, Honolulu, Jun. 11–13, 1996. The performance (or speed) of a VLSI system such as a high-performance microprocessor is closely linked to the value of overdrive ($V_{dd}-V_t$). To the first approximation, an inverter's delay ($t_d$) is:

$$t_d = \frac{2C_L}{\beta V_{DD}}(1-n)\left[\frac{n-0.1}{1-n}+0.5\ln(19-20n)\right] \quad (1)$$

where $n=V_t/V_{dd}$, $\beta=\mu C_{ox}W/L$, and $\mu$ is electron (or hole) mobility depending on the switching off (or on) situation being considered, $C_{ox}$ is the gate capacitance, W/L is the width-to-length ratio, and $C_L$ is the load capacitance. See N. H. E. Weste and K. Eshraghian, *Principles of CMOS VLSI Design: A System Perspective*, 2nd Edition, Addison Wesley, Chapter 4, 1994. To gain performance with complementary metal oxide semiconductor (CMOS) technology, there has been a need for making low $V_t$ MOSFETs. This gain will become larger and larger as $V_{dd}$ continues to be scaled down. See Y. Taur et al., ibid. In CMOS circuits, a typical low $V_t$ device in current technology would have a $V_t$ of 250 mV that is about 100 mV lower than the regular $V_t$ devices, and typical gains estimated from the above formula are about 10%, which is in good agreement with simulation. See L. Su et al., ibid. However, the low Vt devices typically have much higher leakage current than the regular devices (5 to 10 times higher). This high leakage current, among other considerations, inhibits wide-spread-use of low $V_t$ devices in a VLSI design.

One approach to circumvent this limitation that has been adopted is to make low $V_t$ static logic books such as NAND, NOR, and other logic gates and blocks composed of all low-$V_t$ devices, and implement them only in the critical path part of the circuits. Even though a single low $V_t$ logic book would indeed give rise to much higher stand-by power, speed can still be gained without increasing too much system's standby power because the book count of the critical paths is only a small fraction of the total book/device count of the system. By definition, a logic book in the current writing means a basic logic unit/block, such as NAND and NOR gates, a combination of AND and OR gates and inverters (NAND and NOR gates), or a logic block such as an ADDER, MULTIPLEXER or BUFFER, which performs a certain logic function and is treated as a unit by high level circuit/logic or system designers.

The much higher leakage currents of low $V_t$ logic books in some critical parts of a design to gain speed is a particular concern in the deep submicron regime of VLSI circuit design. This concern about high leakage current along with other considerations limits the use of low $V_t$ logic books in the design. This is especially true when the millions of transistors used in current generation microprocessors already dissipate tens of watts of power on a single chip. The problem therefore presented for designers of the next generation of VLSI circuits is whether low $V_t$ and regular $V_t$ devices can be mixed in a single logic book in some fashion that will permit a gain in speed without a significant increase in standby power.

SUMMARY OF THE INVENTION

It is therefore an object of the invention to provide a static logic book with mixed low $V_t$ and regular $V_t$ devices having performance gain without the large increase in stand-by power of the logic book.

It is another object of the invention to extend the use of mixed low $V_t$ and regular $V_t$ devices to dynamic circuits, thereby achieving similar improvements in performance gain in dynamic circuits again without a large increase in stand-by power.

According to the invention, low $V_t$ devices are used to gain speed, and regular $V_t$ devices are used to cut off the off-current of the logic book. The optimization of mixed $V_t$ configurations is important. In accordance with the invention, no single path between an output and ground can be made of all low $V_t$ devices, and no single path between the output and $V_{dd}$ can be made of all low $V_t$ devices. Generally, devices that are connected to $V_{dd}$ and ground should be regular $V_t$ devices, low $V_t$ devices should be connected closest to the output. All low $V_t$ devices should be appropriately reversely biased in their off states. Because its merits in standby power, speed and noise margin, such mixed-low-and-regular-$V_t$ logic books can have a wide use in VLSI designs (e.g., high performance microprocessor design).

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
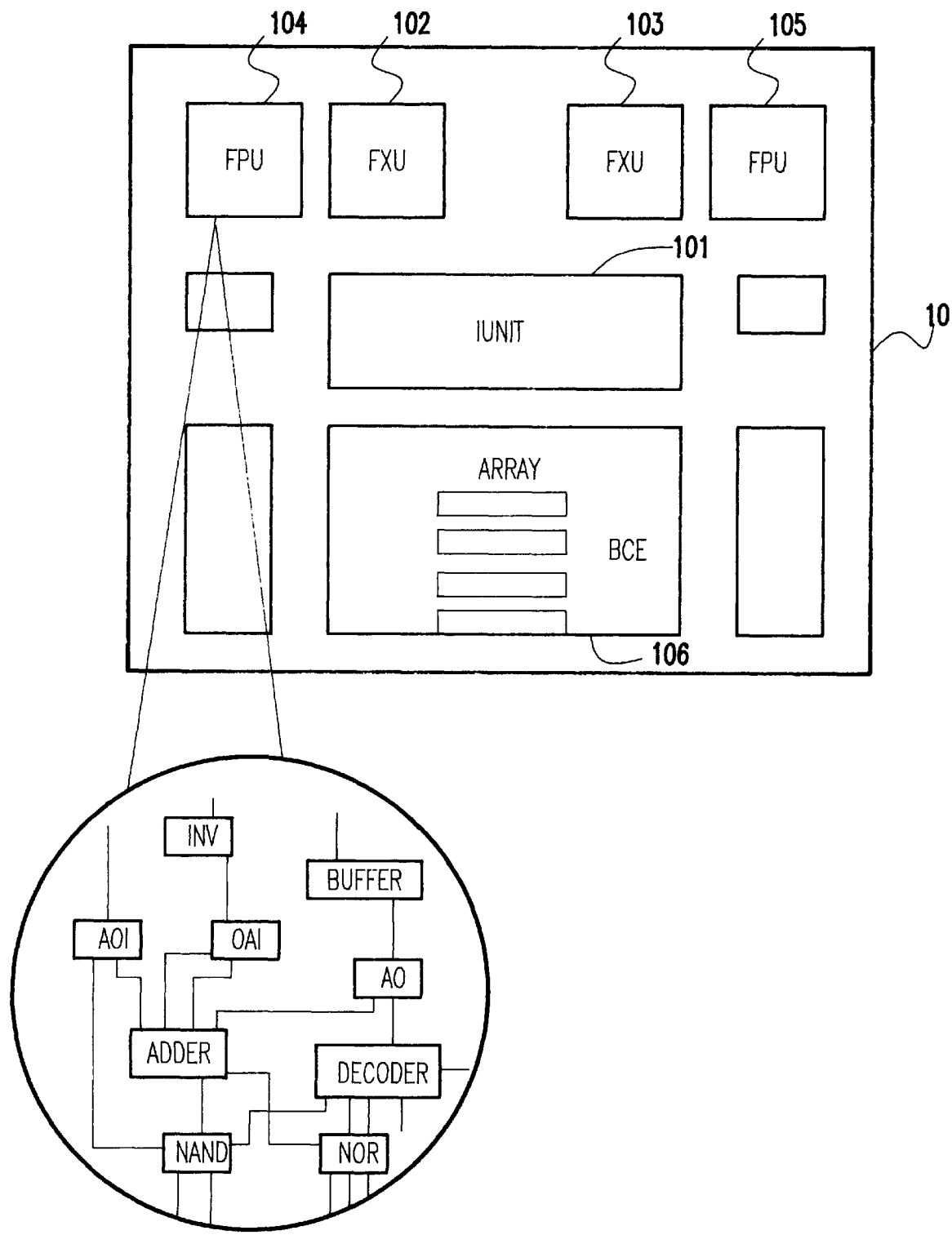
FIG. 1 is block diagram of a microprocessor as a typical example of a complex VLSI circuit which can be fabricated using the principles of the present invention.

Referring now to the drawings, and more particularly to FIG. 1, there is shown a block diagram of a microprocessor 10 as an example of a typical complex VLSI circuit which can be implemented according to the teaching of this invention. The microprocessor is composed of several blocks including an instruction unit (IUNIT) 101, a plurality of execution units, in this case fixed point units (FXUs) 102 and 103 and floating point units (FPUs) 104 and 105, and an array of register files 106 as well as other miscellaneous supporting circuits. The FPU 104 is shown in greater detail to illustrate its composition of basic logic gates and blocks assembled from logic books by a VLSI designer.

Figure 2:
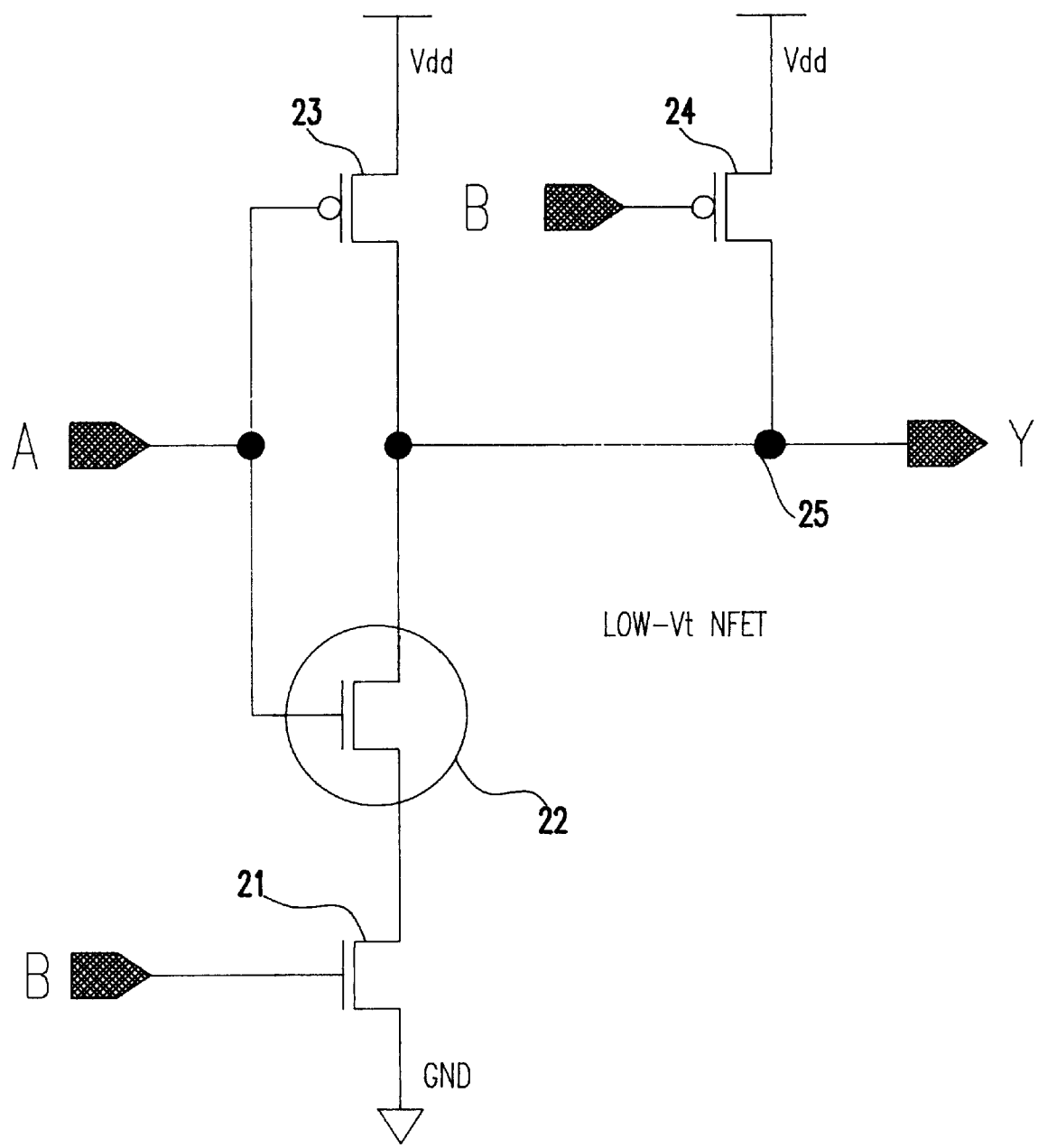
FIG. 2 is a schematic diagram of a two-input NAND gate using mixed low $V_t$ and regular $V_t$ devices in a first configuration illustrating the principles of the invention.

FIG. 2 shows, for a very basic static logic book, a two input NAND gate as an example of the principles of the present invention. The gate comprises two stacked n-channel field effect transistors (NFETs) 21 and 22 and two parallel p-channel field effect transistors (PFETs) 23 and 24. The gates of NFET 22 and PFET 23 are connected together to receive one of the inputs, labeled A, and the gates of NFET 21 and PFET 24 are connected to the second input, labeled B. The output, labeled Y, is taken from the node 25. The circuit design is basically conventional but note that in the two stacked NFETs 21 and 22, one of them, NFET 22, is a low $V_t$ device and the other, NFET 21, is a regular $V_t$ device. The convention used in this disclosure is to circle the low $V_t$ device, the other devices being regular $V_t$ devices. Note also that the low $V_t$ device, NFET 22, is next to the output Y, away from ground, while the source (or drains) of the regular $V_t$ devices are connected to ground (or $V_t$).

Figure 3:
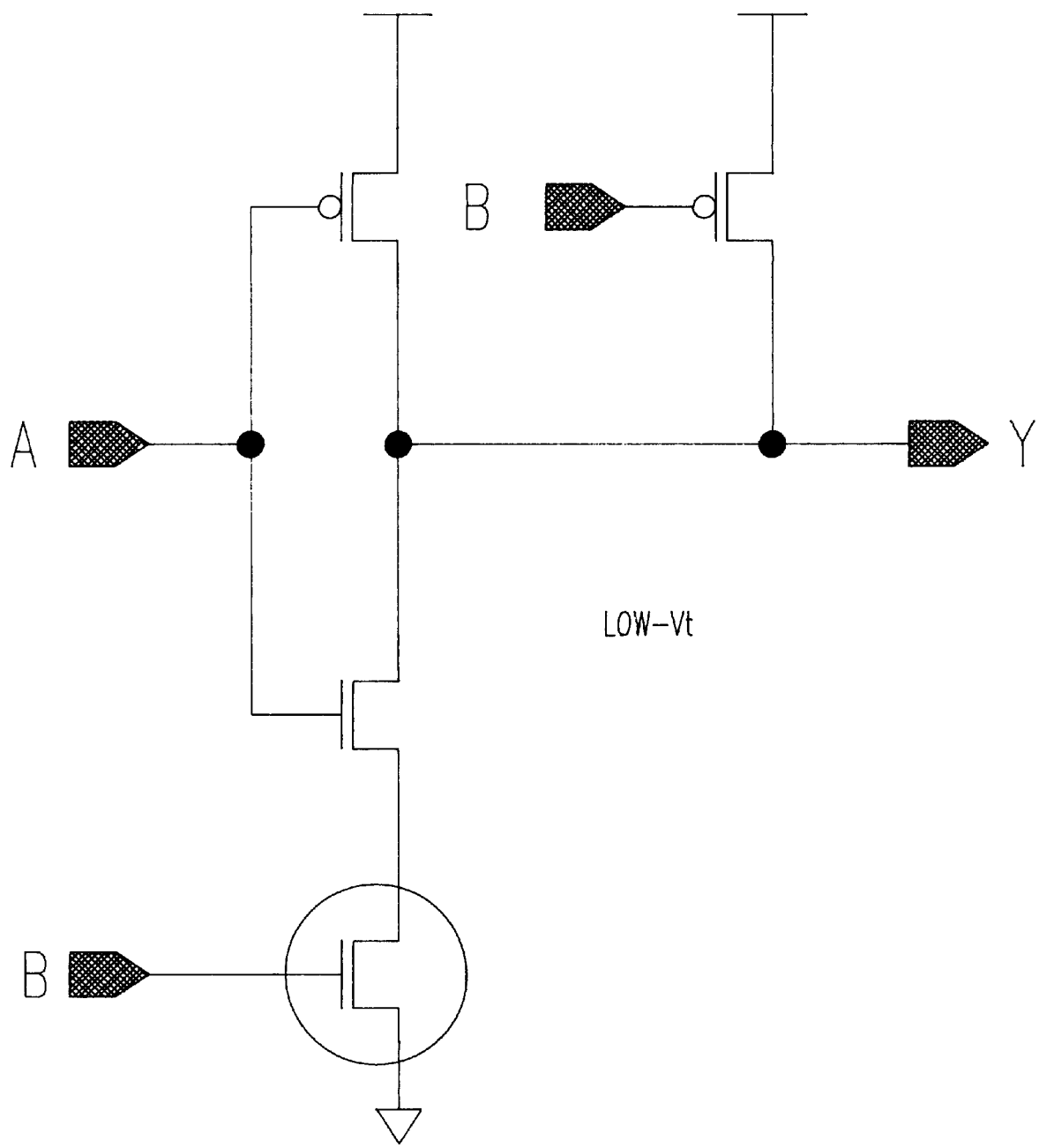
FIG. 3 is a schematic diagram of a two-input NAND gate using mixed low $V_t$ and regular $V_t$ devices in a second configuration.

Of course, there are many possible variations as to how to place, where to place low $V_t$, and to place how many low $V_t$ devices in a mixed $V_t$ logic book in general. For example, one possible configuration is to have a low $V_t$ NFET, as shown in FIG. 3, where the source of the low $V_t$ device is connected to ground, and another possible configuration is to have both a low $V_t$ NFET device and a low $V_t$ PFET device. They are just trivial extensions of the same basic idea. As our optimization algorithm will show later, these configurations are inferior to the configuration shown in FIG. 2 in terms of gaining speed and minimizing leakage current.

Figure 4:
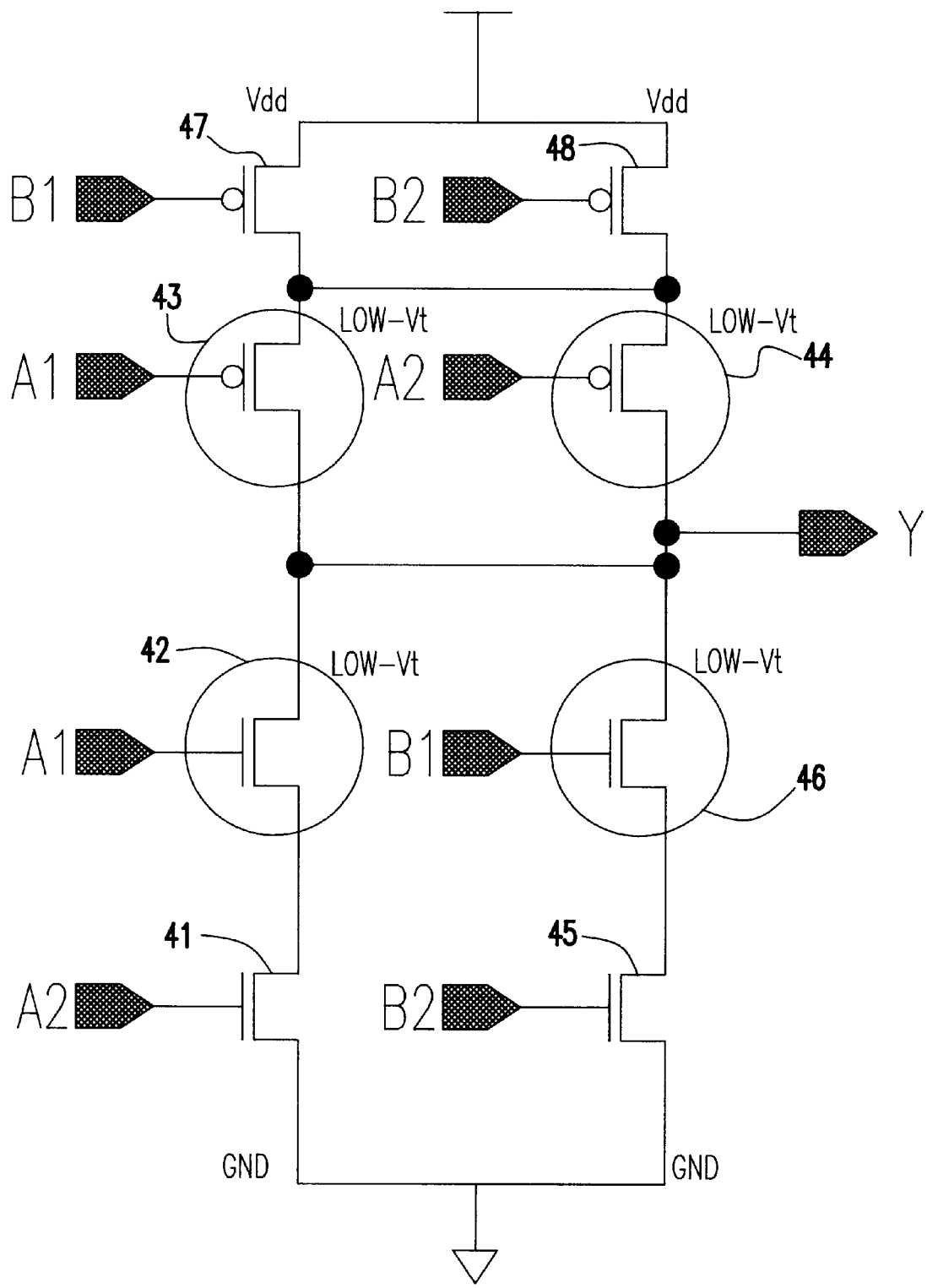
FIG. 4 is a schematic diagram of an AND-OR-INVERT (AOI) logic block implemented with the teachings of the invention.

A variety of logic books can be built with this mixed $V_t$ scheme, such as AND-OR-INVERT (AOI) logic blocks, OR-AND-INVERT (OAI) logic blocks, four input NAND gates, three input NOR gates, and the like, and examples are shown in FIGS. 4 to 7. Specifically, FIG. 4 shows a logic block, commonly referred to as an AOI block because it performs an AND-OR-INVERT function. Logically, the output Y is $$\overline{(A1 \cdot A2) + (B1 \cdot B2)}.$$

If only the stacked NFETs 41 and 42 and the parallel PFETs 43 and 44 for the inputs A1 and A2 are considered, the structure is that of the NAND gate (AND-INVERT) of FIG. 2. Likewise, the stacked NFETs 45 and 46 and the parallel PFETs 47 and 48 for the inputs B1 and B2 form a structure of a NAND gate. Note that in this circuit NFETs 42 and 46 and PFETs 43 and 44, which are closest to the output, are low $V_t$ devices. NFETs 41 and 45, closest to ground, and PFETs 47 and 48, closest to $V_{dd}$, are regular $V_t$ devices.

Figure 5:
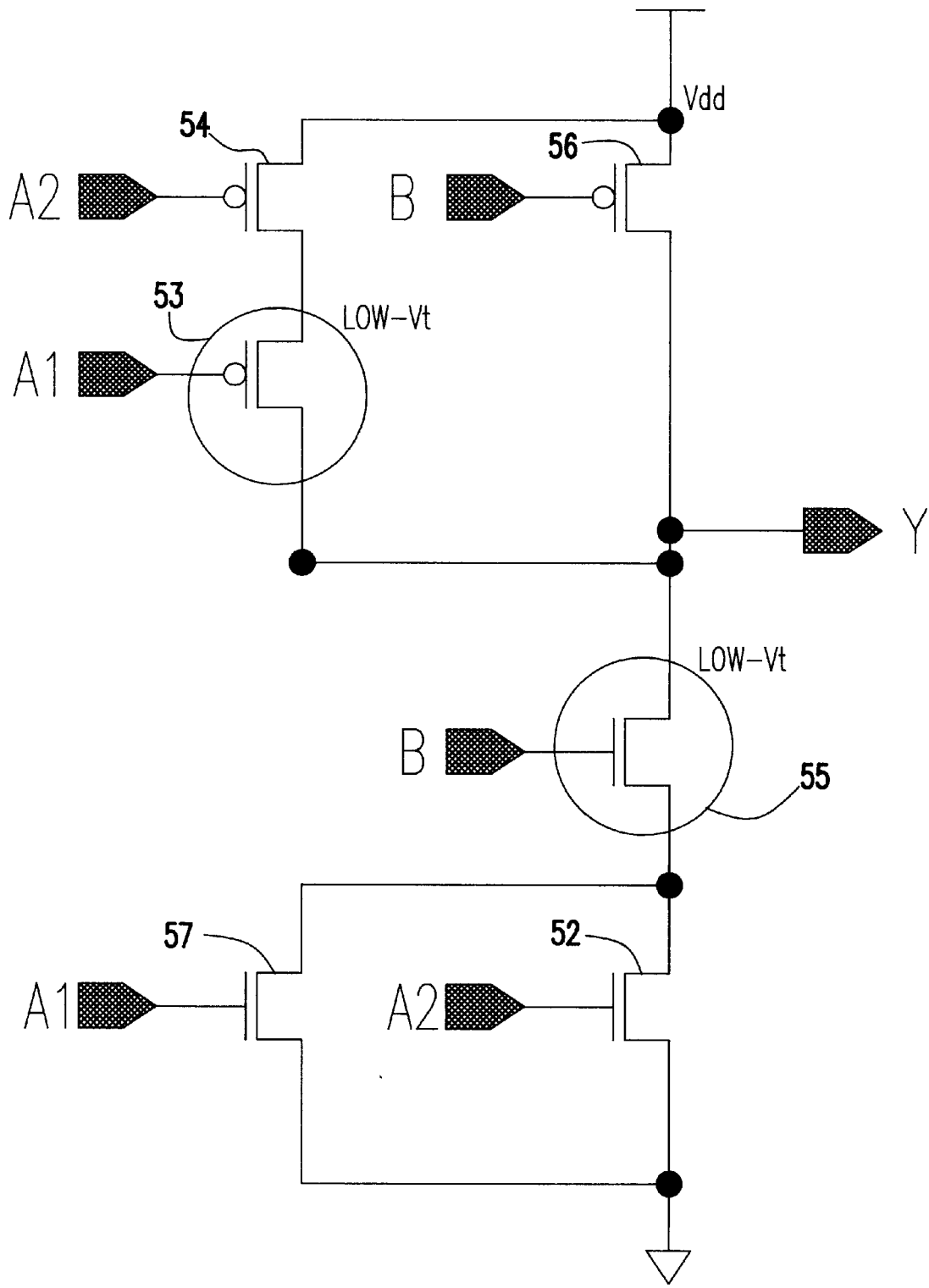
FIG. 5 is a schematic diagram of an OR-AND-INVERT (OAI) logic block implemented with the teachings of the invention.

FIG. 5 shows a logic block, commonly referred to as an OAI block because it performs an OR-AND-INVERT function. Logically, the output Y is $$\overline{(A1 \cdot A2) \cdot B}.$$

The circuit is composed of an OR gate comprising parallel NFETs 51 and 52 and stacked PFETs 53 and 54. The AND function is made in combination with NFET 55 and PFET 56. In this case, PFET 53 and NFET 55, which are closest to the outputs, are low $V_t$ devices. NFETs 51 and 52, closest to ground, and PFETs 54 and 56, closest to $V_{dd}$, are regular $V_t$ devices.

Figure 6:
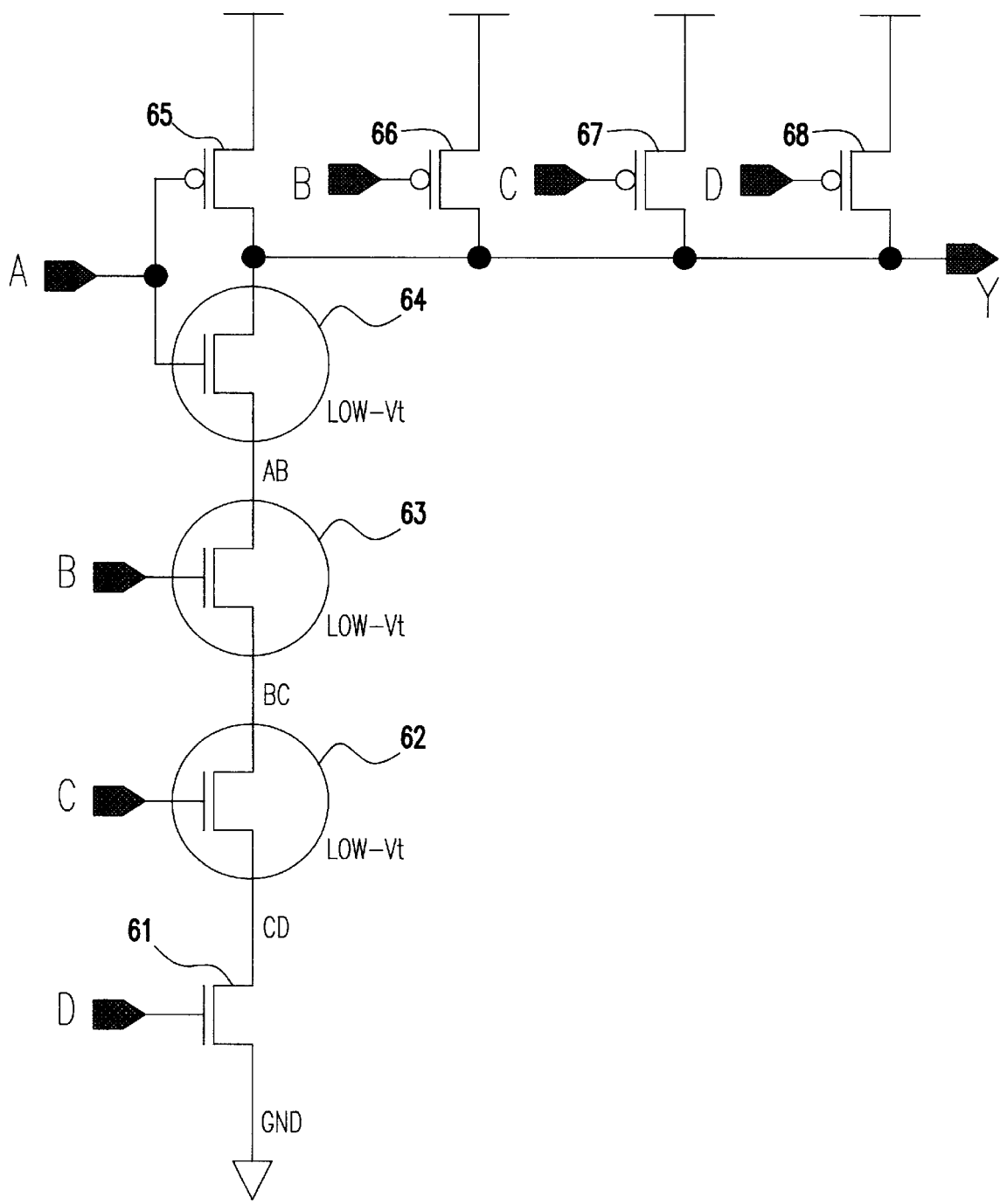
FIG. 6 is a schematic diagram of a four-input NAND gate implemented with the teachings of the invention.
Figure 7:
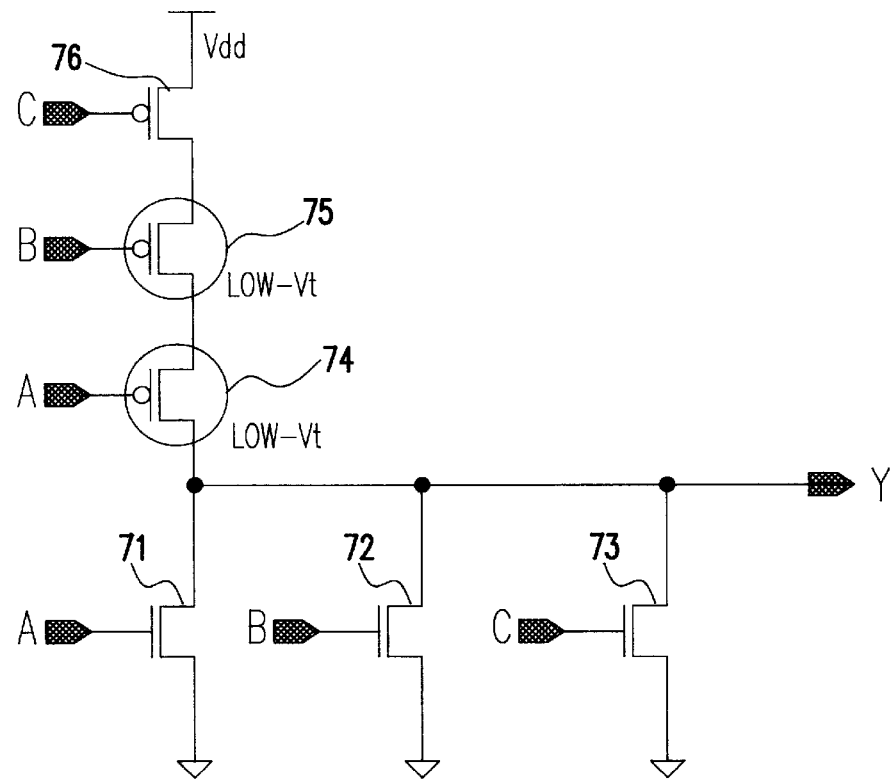
FIG. 7 is a schematic diagram of a three-input NOR gate implemented with the teachings of the invention.

FIG. 6 shows a four input NAND gate, while FIG. 7 shows a three input NOR gate. In FIG. 6, stacked NFETs 62, 63 and 64 are low $V_t$ devices, while NFET 61, closest to ground, and PFETs 65 to 68, closest to $V_{dd}$, are regular $V_t$ devices. In FIG. 7 stacked PFETs 74 and 75, closest to the output, are low $V_t$ devices, while NFETs 71, 72 and 73, closest to ground, and PFET, closest to $V_{dd}$, are regular $V_t$ devices.

Figure 8:
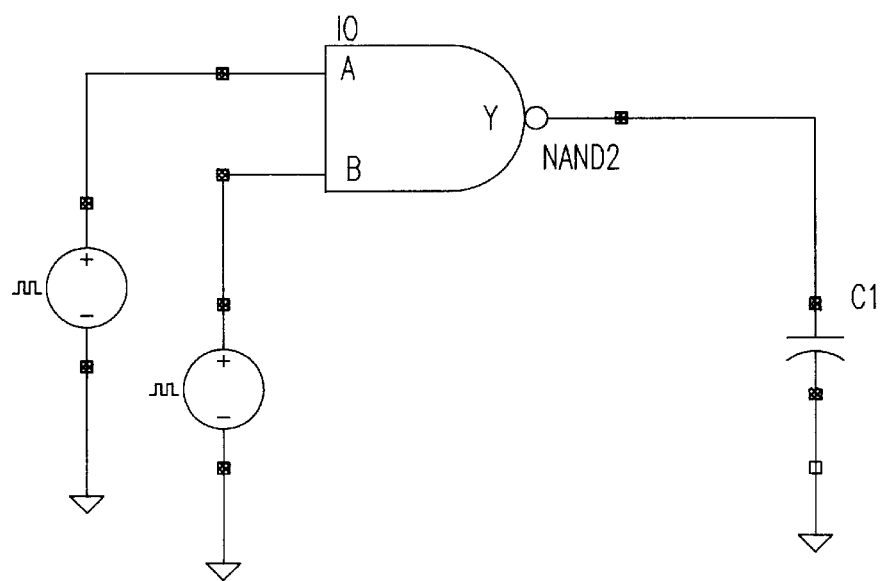
FIG. 8 is a two-input NAND gate driving a capacitive load.

To show the speed gain and the low leakage current of the mixed $V_t$ books according to the invention, these logic books are used to build some simple circuits. The first circuit shown in FIG. 8 is a two input NAND gate driving a capacitance which is about twice its input capacitance, or about 24 femto Farads (fF) (gain 2). The input slew is set at typical slew of 100 pico seconds (psec). Simulation results with mixed two input NAND gate book as well as the regular and low $V_t$ two input NAND gate books based on current technology is listed in Table 1.

TABLE 1

| Logic Book (NAND2) | Rise to Fall (psec) | Fall to Rise (psec) | Off Current (nA) |
|---|---|---|---|
| Regular $V_t$ | 42 | 63 | 0.47 |
| Mixed $V_t$ (FIG. 2) | 37 | 63 | 0.57 |
| Low $V_t$ | 36 | 58 | 4.27 |
| Mixed $V_t$ (FIG. 3) | 41 | 63 | 1.63 |

The results (in the Rise to Fall column) clearly show a gain in speed of about 10% with low $V_t$ books. However, the off current is very high (700% times; higher than the regular $V_t$ book). With mixed $V_t$ books using the principles of Configuration 1 shown in FIG. 2, we can gain speed about 5% with only 20% increase in leakage current.

In the mixed $V_t$ logic book, it appears that there is a degree of freedom as to which devices should be made low $V_t$ and which should remain regular $V_t$. The optimization algorithm described later in terms of considerations of speed, leakage current and noise can help us make a clear choice as to which device should be made low $V_t$ and which should not. To appreciate the importance of such optimization in mixed $V_t$ logic book, compare the simulation results from two different configurations of mixed $V_t$ logic book; Configuration 1 shown in FIG. 2 and Configuration 2 shown FIG. 3. The only difference between the two is the order of the low $V_t$ and regular $V_t$ devices. Note that the results of the two is very much different. As summarized in Table 1, Configuration 1 is 4% faster than Configuration 2, and yet its leakage current is only ⅓ of Configuration 2. In other words, Configuration 1 is 5% faster than the regular $V_t$ book with only 20% increase in leakage current, while Configuration 2 is 1% faster than the regular Vt book but with as much as 250% increase in leakage current.

Figure 9:
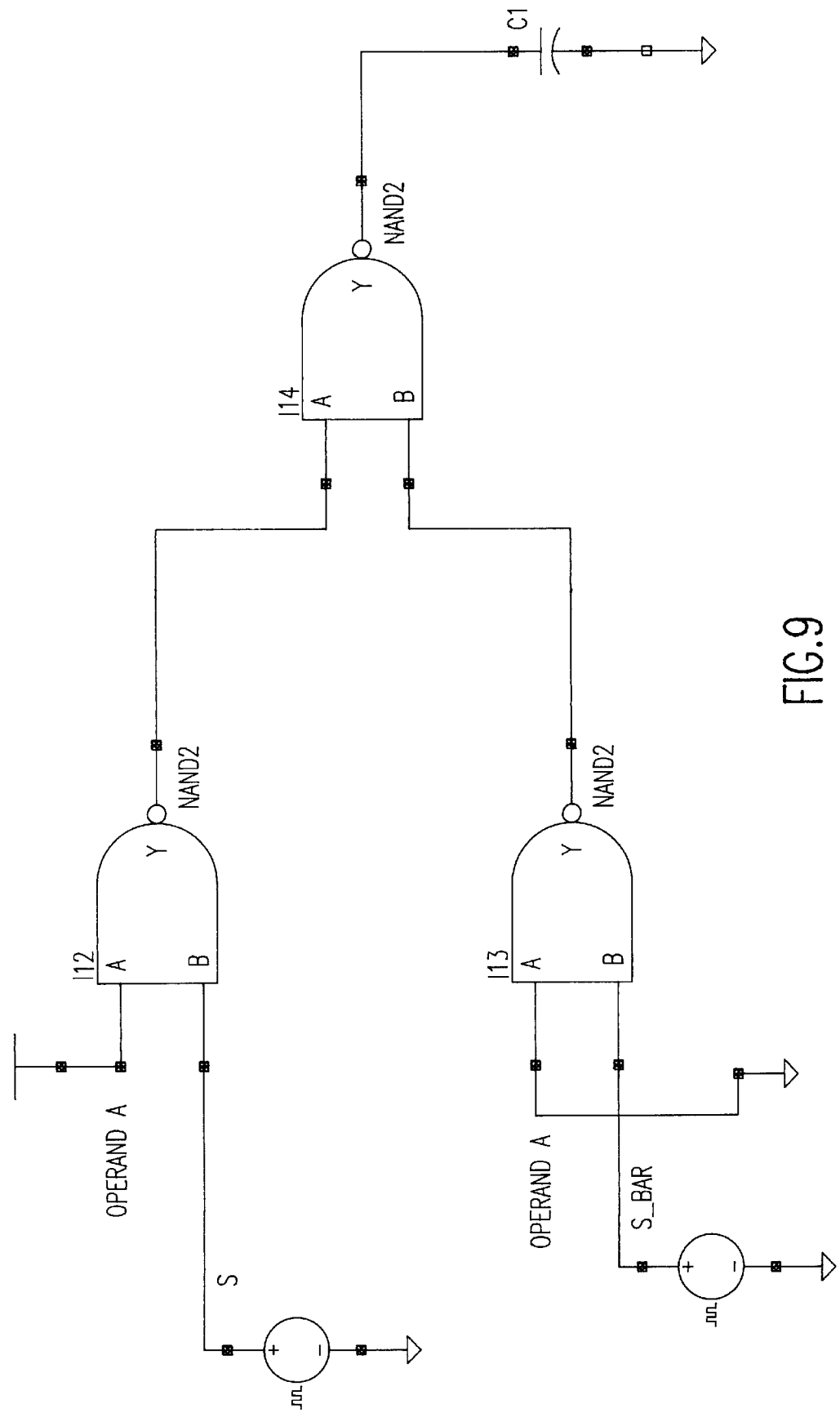
FIG. 9 is a schematic diagram of a two way multiplexer implemented with three different types of two-input NAND logic books.

As another example of a simple circuit with mixed $V_t$ logic books, consider a two-way multiplexer as shown in FIG. 9. This basic logic book can be built from three two-input NAND books. The delay and leakage current simulation results are shown in Table 2.

TABLE 2

| Logic Book (NAND2) | Select A (psec) | Select B (psec) | Off Current (nA) |
|---|---|---|---|
| Regular $V_t$ | 60 | 69 | 4.3 |
| Mixed $V_t$ | 57 | 65 | 4.6 |
| Low $V_t$ | 54 | 62 | 32 |

It is very clear that a gain in speed of 10% can be achieved with low $V_t$ books, but the circuit suffers from 700% times higher leakage current! With mixed $V_t$ books, a gain in speed of 5% is achived, but the leakage current is only about 10% higher than the regular books. Therefore, 70 times more mixed $V_t$ books can be applied in the design than low $V_t$ books, which would give rise to the same leakage power consumption. In other words, a VLSI designer can apply the mixed $V_t$ books in 70 more places in the design than the low $V_t$ books.

Figure 10:
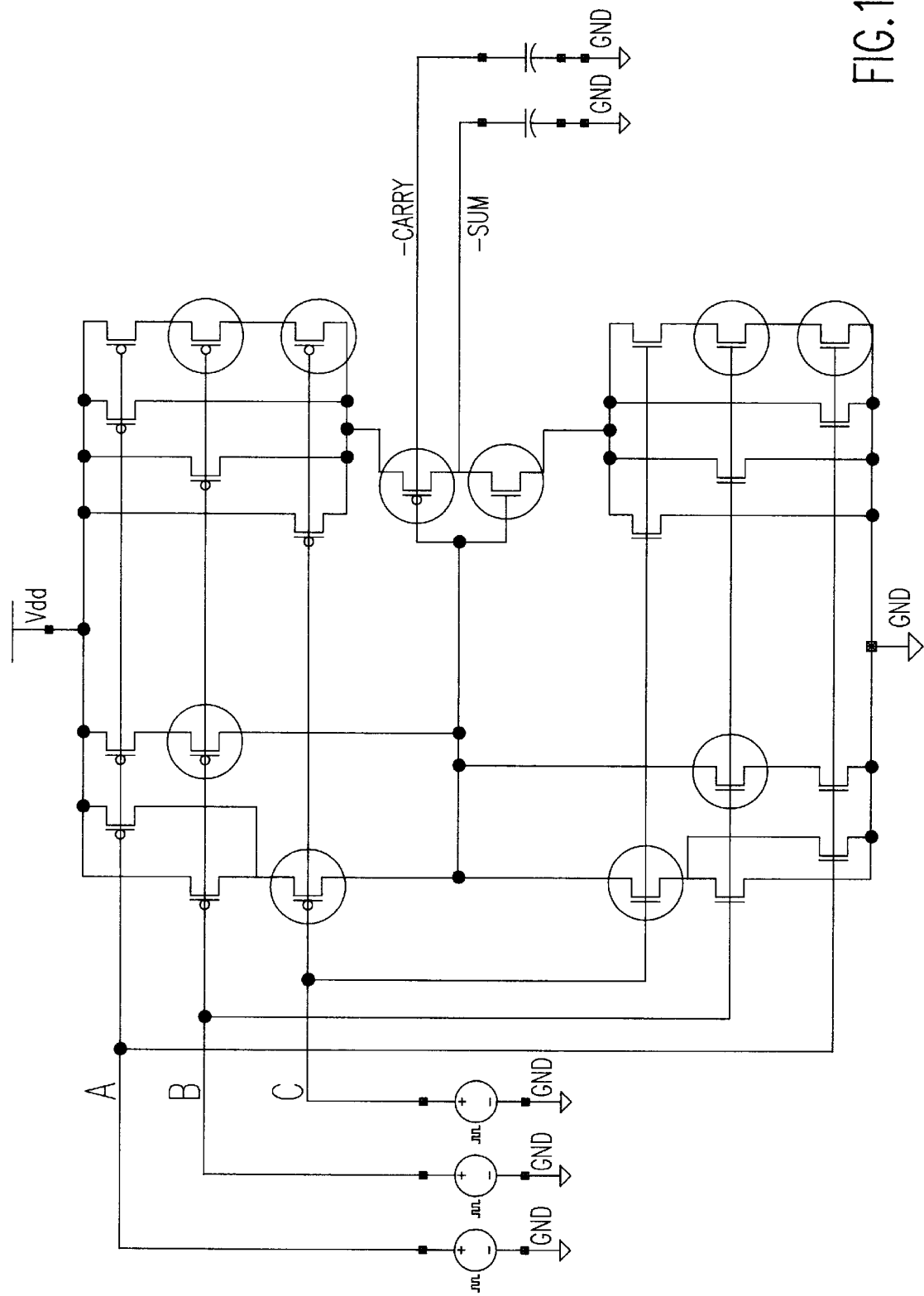
FIG. 10 is a schematic diagram of one-bit adder using mixed $V_t$ devices according to the teachings of the invention.

A more complex circuit is shown in FIG. 10. This is a one-bit full ADDER with SUM and CARRY outputs. It consists of only 26 transistors. The comparison results is shown in Table 3, which reveals clear improvements in both speed, and leakage current.

TABLE 3

| Logic Book (ADDER) | Delay of Sum (0→1) (psec) | Delay of Sum (1→0) (psec) | Delay of Carry (0→1) (psec) | Delay of Carry (1→0) (psec) | Off Current (nA) |
|---|---|---|---|---|---|
| Regular $V_t$ | 130 | 156 | 57 | 92 | 2 |
| Mixed $V_t$ | 122 | 146 | 53 | 87 | 2.8 |
| Low $V_t$ | 117 | 142 | 50 | 85 | 12 |

The mixed $V_t$ approach particularly has advantages in one important type of circuit in the arithmetic logic unit (ALU) which bears Boolean characteristics $$f(x_1',x_2',x_3', \ldots) = f'(x_1, x_2, x_3, \ldots)$$

where x' is the complement of x. With such characteristics, the NFET and PFET are electronic duals of each other. An example of such circuits is the adder shown in FIG. 10.

It is also possible to design a mixed $V_t$ book for an inverter, but it is a little trickier. Since there are only two devices in this logic book. The choices are limited to making either the PFET or the NFET the low $V_t$ device, but both can not be low $V_t$ devices. Another subtle consideration stems from where and how such an inverter is used in circuit. Normally such mixed $V_t$ configuration would give some advantage in lowering the standby power. However, if the output/input is asserted to one particular polarity, care has to be exercised to determine if a low $V_t$ NFET device or low $V_t$ PFET device should be used. All of these consideration can be made into a library or database of a computer program.

Having shown the simulation results, the physics behind why some of the mixed $V_t$ configurations can dramatically cut down the leakage current of the logic book while some others can not will be described. From this understanding, a general optimization algorithm can be developed for arbitrary logic books. The two-input NAND gate circuit of FIG. 2 is shown again in FIG. 11, with annotations of the gate-to-source bias ($V_{gs}=V_g-V_s$) and the internal node voltage ($V_x$). Note the $V_{gs}$ for the regular $V_t$ NFET device 111 is simply $V_{gB}$, but the $V_{gs}$ for the low $V_t$ NFET device 112 in this particular configuration is $V_{gA}-V_x$. In its off state where $V_{gA}=V_{gB}=0$, the low $V_t$ NFET device 112 is actually reversely biased with $V_{gs}=-V_x$. This reverse bias on the low $V_t$ NFET device 112 effectively suppresses the leakage of the logic book as the leakage current depends exponentially on the reverse bias (see FIG. 12 for I-V characteristics). This point is also vividly illustrated in the following analytical solution for the leakage current in the mixed $V_t$ two input NAND gate.

As mentioned above, the two following rules in the optimized mixed $V_t$ configuration must be followed:
(1) Between HIGH (i.e., $V_{dd}$) and LOW (i.e., GROUND), there must be at least one regular $V_t$ device. It serves as high resistance between HIGH and LOW to reduce the leakage current.
(2) In addition, we have to choose configurations where the low $V_t$ devices become reversely biased so as to reduce its leakage current effectively.

Rule (1) is fairly easy to understand; however, it is very important to understand rule (2). This is the key why we can cut down leakage current so significantly by introducing the mixed $V_t$ logic books.

Figure 11:
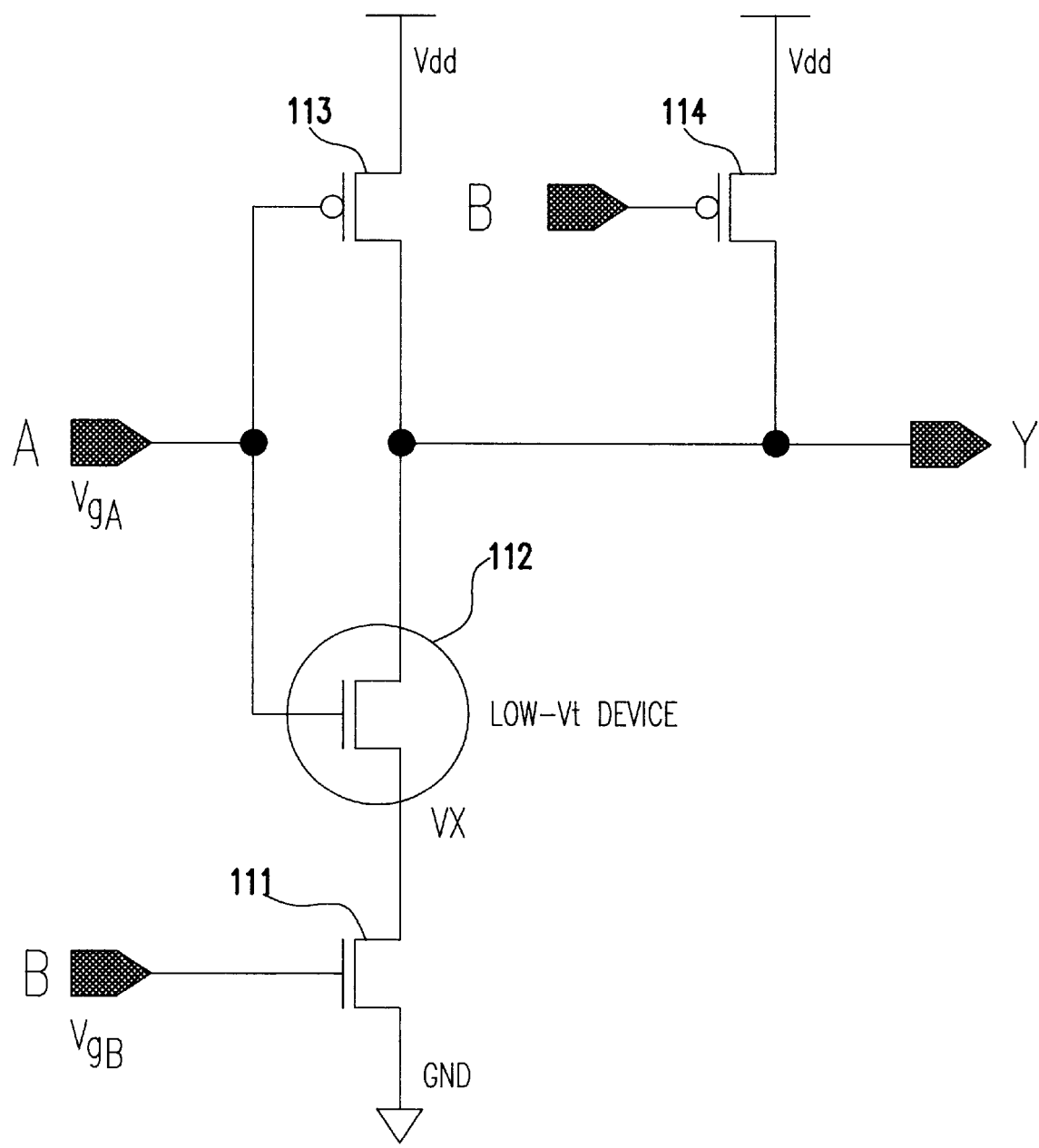
FIG. 11 is a mixed two-input NAND gate as shown in FIG. 2 with voltage annotations.
Figure 12:
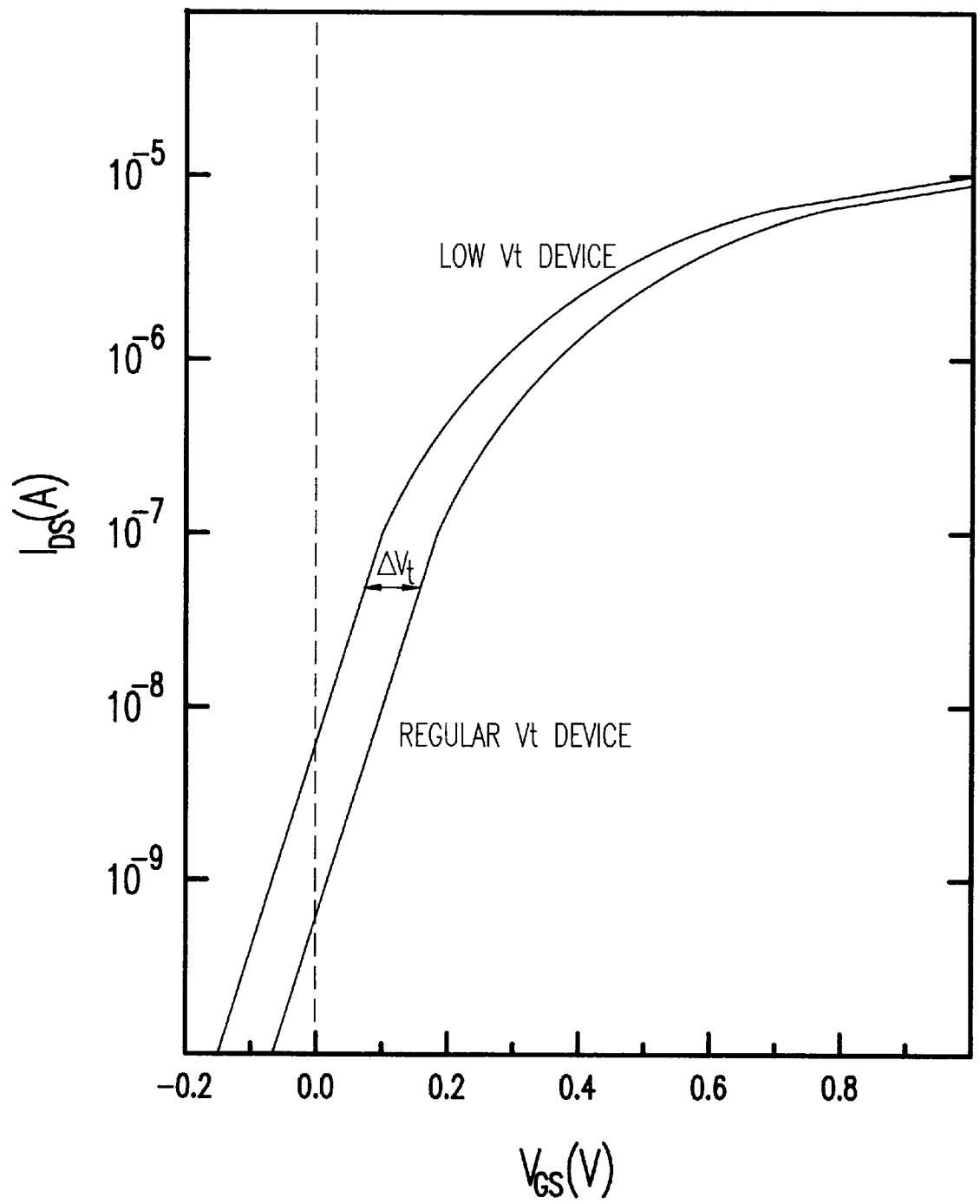
FIG. 12 is a graph showing subthreshold I-V characteristics for both regular $V_t$ and low $V_t$ devices.

Consider the mixed $V_t$ Configuration 1 shown in FIG. 11 (i.e., FIG. 2), where the low $V_t$ NFET device is next to the output away from ground. In this configuration, the regular $V_t$ device's gate bias is $V_{gs}=V_g-V_s=V_g$ while the low $V_t$ device's gate bias is $V_{gs}=V_g-V_x$. The subthreshold I-V characteristics of the two devices are shown in FIG. 12. The leakage current in the subthreshold region is approximated as:

$$I = I_o \left(\frac{W}{L}\right) \exp(\beta(V_{gs} - V_t))(1 - \exp(-\beta V_{ds}))$$

where $I_o$ is some constant current defined at the threshold voltage (typically at 40 nA), W/L is the width/length ratio, $\beta=q/nkT\approx444/S$ in current technology where S is the commonly used threshold slope in units of mV/DECADE, and $n=1+C_{dep}/C_{ox}$ and $C_{dep}$ is the substrate depletion capacitor and $C_{ox}$ is the gate capacitance. See S. M. Sze, *Physics of Semiconductor Devices*, $2^{nd}$ Edition, John Wiley & Sons, Chapter 7, 1981.

In its off state, all the inputs set LOW and its output is HIGH ($V_{dd}$). Therefore, the regular $V_t$ device has $V_{gs}$ equal to zero, while the low $V_t$ device's gate voltage ($V_{gs}=V_g-V_x=-V_x$) is actually negative. Using subscript 1 and r to denote for low $V_t$ and regular $V_t$ devices, for the mixed $V_t$ two input NAND circuit, we get:

$$I_l = I_o \left(\frac{W_l}{L_l}\right) \exp(-\beta_l(V_x + V_{tl}))(1 - \exp(-\beta_l(V_{dd} - V_x)))$$

$$I_r = I_o \left(\frac{W_r}{L_r}\right) \exp(-\beta_r V_{tr})(1 - \exp(-\beta_r V_x))$$

where $I_l=I_r=I$, and $I_l$ and $I_r$ are the currents flowing through the low $V_t$ and regular $V_t$ devices, respectively. Circuit theorem requires $I_l=I_r=I$. The above equations can be solved numerically to calculate $V_x$ and I, which yield the simulation results mentioned above.

To illustrate the key point, let us make some simplifications and assumptions here: (1) without losing generality, we take $W_l/L_l=W_r/L_r$, (2) we approximate $\beta_l\approx\beta_r$, and (3) we assume that $V_x$ is much greater than kT=26 mV. With these assumptions, the above equation gives $V_x=V_{tr}-V_{tl}=\delta V_x$. The leakage current is $I=I_oW/L \exp(-\beta V_{tl})$, which is exactly the leakage current for a regular $V_t$ inverter and it has no sensitivity to $\delta V_t$.

For a two input NAND gate composed of all low $V_t$ devices, the leakage current is proportional to $\exp(-\beta V_{tl})$, which can be orders of magnitude higher than the leakage current for the regular or mixed $V_t$ books. Because of the exponential dependence, the leakage current increases very rapidly with lowering $V^{tl}$, and immediately imposes an limit on how low the $V_{tl}$ can go. This limit does not exist for the optimized mixed $V_t$ books of the present invention.

As the solution above indicates, the voltage of the internal node is approximately $V_x=V_{tB}-V_{tA}\approx100$ mV. With typical subthreshold slope of 85 mV/DECADE, this 100 mV reverse bias is capable of decreasing the leakage current by more than one order of magnitude.

This reverse bias also increases the noise margin of the mixed $V_t$ logic book. This is because in order to turn on the low $V_t$ device, the input voltage glitch now has to be greater than $V_{tl}+V_x\approx V_{tr}$, (where $V_{tl}$, $V_{tr}$ are the threshold voltages of the low $V_t$ and regular $V_t$ devices, respectively) By carefully mixing the regular $V_t$ devices and low $V_t$ devices in a single logic book, we can retain good noise margin in our mixed $V_t$ book. In fact, we can make the noise margin of the mixed $V_t$ books close to that of the regular $V_t$ books by careful design. The key, again, is to use regular $V_t$ device to enhance the noise margin and to use low $V_t$ device to gain in performance. This is also confirmed by simulation, and such consideration can be incorporated into a computer program.

Based on the above descriptions, the optimization algorithm according to the invention will now be described. This algorithm converts arbitrary regular $V_t$ static circuits (no matter how complex they are) into mixed $V_t$ logic books which perform the same logic and optimized for speed, leakage current, power, and noise margin criteria. This optimization algorithm form the foundation for mixed $V_t$ computer optimization programs. The optimization criteria are composed of three factors: speed, standby power, noise margin, and can be extended to cover other factors like up/down switching, short-circuit power and transient switching power. A criteria there is no single path from $V_{dd}$ to ground can be made of all low $V_t$ devices without a single regular $V_t$ device. A more restrictive criteria is to search all the possible paths from the outputs to either ground or $V_{dd}$ no single path should be made exclusively with low $V_t$ devices. Another important criteria would be in analyzing the timing of all paths in the single logic book and have the most critical one made most low $V_t$ devices.

Having a logic book as a black box helps partitioning the task in a VLSI design and helps separating the transistor level/device level work from the higher level gate optimization. It can be integrated into known circuit design programs for macro and chip level synthesis and timing optimization. In situations where the box (logic book) is made transparent to expose its device/transistor contents, transistor level or switch level timing tools have to be used.

To summarize, the optimization algorithm contains the following steps:

STEP 1: Rules of Construction:
  Rule 1.1: No single path between $V_{dd}$ and ground can be composed entirely of low $V_t$ devices.
  Rule 1.2: No single path between output and ground can be composed entirely of low $V_t$ devices.
  Rule 1.3: No single path between output and $V_{dd}$ can be composed entirely of low $V_t$ devices.
  Rule 1.4 (recommended): The devices that are connected to $V_{dd}$ and ground should be regular $V_t$ devices.
  Rule 1.5: Each low $V_t$ device should be reversely biased in its off state.

STEP 2: Criteria:
  Rule 2.1: Speed gain of the circuit must be greater than the minimum speed gain set by the designer.
  Rule 2.2: Leakage current in the circuit must be less than the leakage current limit set by the designer.
  Rule 2.3 (optional): If a cost function is defined, the value of the cost function must be smaller than the cost function limit set by the designer. A cost function is defined to reflect the trade-off between performance, speed, leakage current, processing complexity and yield issue.
  Rule 2.4: The merit functions for each configuration is evaluated. A merit function is defined by designer and tool developer to reflect the overall rating of the configuration. For speed-driven microprocessor design, a clear choice for merit function is −slack or −slack/((leakage current increase)$^\gamma$+$\eta$(cost function)), where $\gamma$ and $\eta$ are parameters. Note the latter definition is essentially an extension of the slack definition that also takes into account leakage current increase and cost function. It reduces to −slack/2 when we set $\gamma=0$ and $\eta=0$. A slack is conventionally defined as the arrival time minus required arrival time, and it applies to both early-mode and late-mode analysis.

STEP 3: Optimization Procedures:

For small circuits, all the configurations that are passed STEP 1 and STEP 2 should be simulated to determine the best configuration with maximum value of merit function.

For very large circuits, such exhaustive simulations are too timing-consuming. The number of configurations increase as $2^N-M_1-M_2$, where N is the device count in the circuit and $M_{1,2}$ are the numbers screened out in STEP 1 and STEP 2.

An alternative optimization technique is to use a static timer to find all critical paths and to optimize each critical path until the gain in the merit function is less than a predetermined number set by the designer.

In addition, some circuit properties can be used to simplify the optimization procedures. For example, for symmetric circuits such as shown in FIG. 10 where NFETs and PFETs are circuit duals of each other, the number of configurations that we need to examine is reduced to $2^{N/2}-M_1-M_2$. In general, we can group the devices of similar properties that are needed for the same treatment into a device group. If we make such group low $V_t$, we make all the devices in such group low $V_t$. If we make such group regular $V_t$, we make all the devices in such group regular $V_t$. Furthermore, we can use a hierarchical approach to define low $V_t$ device blocks which in turn are composed of low $V_t$ device groups. Suppose we have n device groups in a circuit, the number of configurations that we need to examine is then reduced to $2^n-M_1-M_2$.

The number of configurations we need to examine is further reduced by using the stage approach described below. The transistors whose sources or drains are directly connected to ground or $V_{dd}$ are labeled as Stage 0. The transistors whose sources or drain are connected to Stage 0 are labeled as Stage 1, those connected to Stage 1 are in turn labeled as Stage 2, etc. The last stage is the stage connected to output labeled as Stage N. An efficient way of converting regular $V_t$ logic books to mixed $V_t$ logic books is to convert the transistors of the same stage as a device group to make them all low $V_t$ at the same time. The sequence of the conversion starts from Stage N and propagates to Stage 1. No devices in Stage 0 should be converted to low $V_t$ because it violates Rule 1.5 in STEP 1. The number of configurations in this approach is reduced to the stage number N. This approach is particularly useful in the early phase of the design when no concrete knowledge of the critical path is available, and it is very time-efficient.

STEP 4: Loop through Steps 1 to 3 until satisfactory results are obtained.

Figure 13:
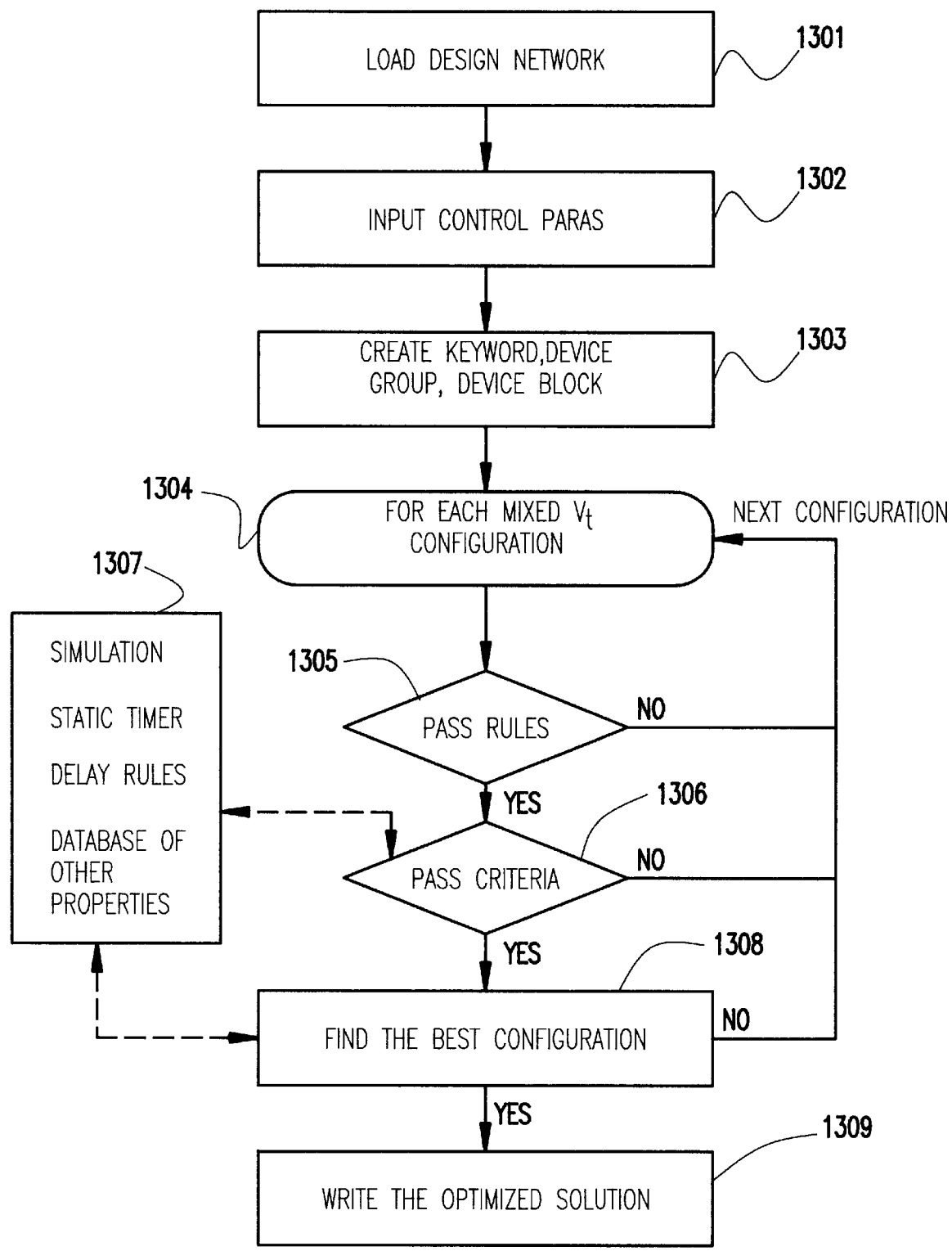
FIG. 13 is a flow diagram illustrating the optimization process according to the invention.

The flow chart of the above algorithm is shown in FIG. 13. The process begins by loading the design network in function block 1301. The control parameters are input in function block 1302. To complete the initialization process, keyword, device group and device block are created in function block 1303 by the designer. At this point, the process enters a processing loop which tests each configuration in sequence, as indicated in operation block 1304. A test is made in decision block 1305 to determine if the current configuration being tested pass the rules. If not, the process loops back to operation block 1304 to retrieve the next configuration to be tested. If the current configuration passes the rules, a test is next made in decision block 1306 to determine if the current configuration also pass the criteria. This is determined by simulation, static timer, delay rules, and access to a database of other properties in block 1307. If not, the process loops back to operation block 1304 to retrieve the next configuration to be tested. If the current configuration pass the criteria, access is again made to block 1307 by function block 1308 to find the best configuration. If a best configuration is not found, the process loops back to operation block 1304 to retrieve the next configuration to be tested. When the best configuration is found, it is output as the optimized solution in function block 1309.

Also mentioned below is the use of mixed $V_t$ logic book for tristate buffer since it is a common circuit type in designing latch and memory devices. One implementation uses regular $V_t$ devices for CLOCK INPUT and low $V_t$ devices for the DATA INPUT. Care has to be exercised in such designs because different $V_t$ devices turn on/off at different voltages, and the glitches can be a hazard.

As the second aspect of this invention, it is important to emphasize one particular type of circuit family which are very important for high speed microprocessors called dynamic circuits. In ultra fast microprocessors, it is essential to use such a circuit family. Yet the current limitations of the low $V_t$ books in leakage current and noise sensitivity make its use in this circuit family very tricky and difficult. The current consensus in design is to not use any low $V_t$ devices/logic books in dynamic logic.

Figure 14:
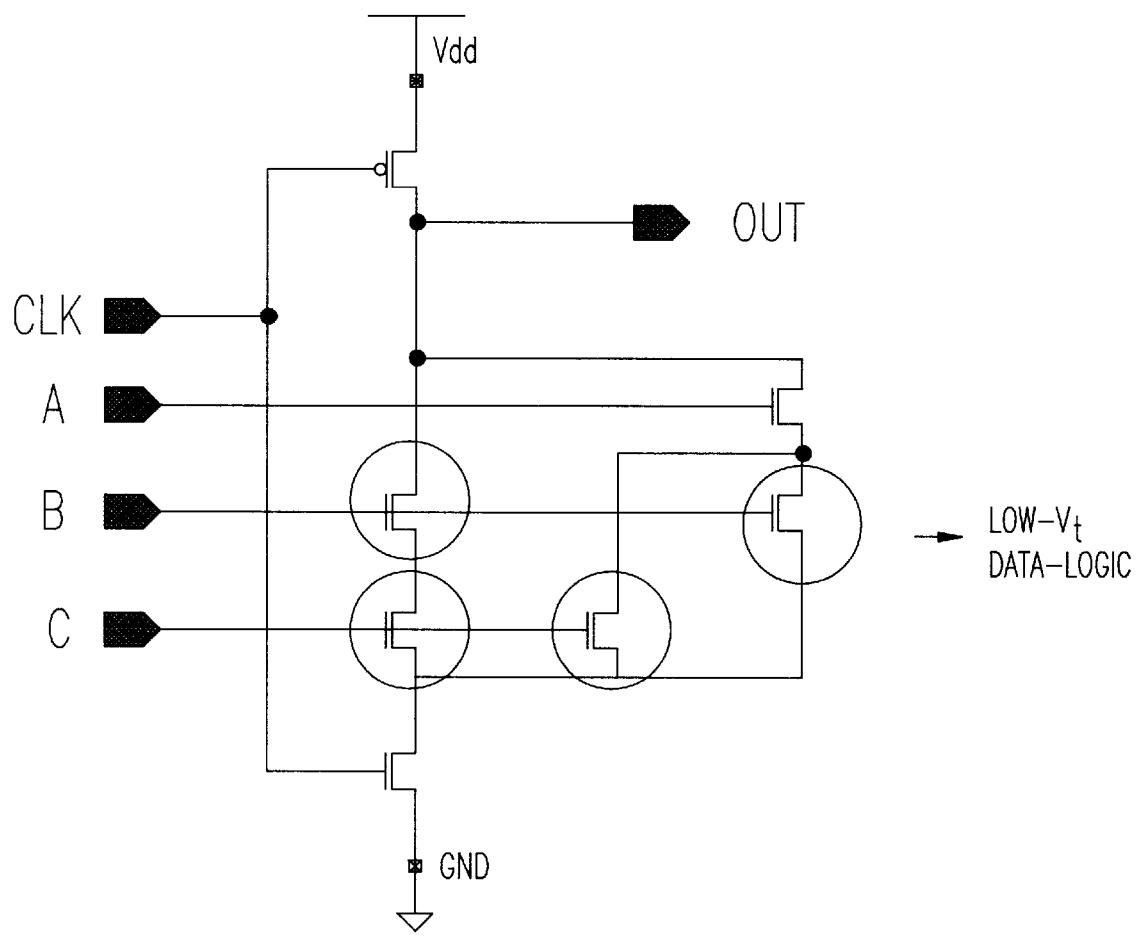
FIG. 14 is a schematic diagram of an example of a mixed Vt dynamic circuit book.

The mixed $V_t$ logic books according to the teaching of this invention have unique advantages in this circuit family to ultimately gain speed for the fastest microprocessors. For instance, regular $V_t$ MOSFETs can be used for CLOCK input/control while low $V_t$ devices can be used for NMOS type of data logic part to gain speed. The example shown in FIG. 14 is a CARRY generation circuit. Again, note the locations of the low $V_t$ devices. For the dynamic circuit shown in FIG. 14, the simulation results are shown in Table 4.

TABLE 4

| Logic Book (CARRY) | Evaluation Delay (psec) | Leakage Current (nA) |
| --- | --- | --- |
| Regular $V_t$ | 48 | 0.4 |
| Mixed $V_t$ | 46 | 0.57 |
| Low $V_t$ | 44 | 2.9 |

Figure 15:
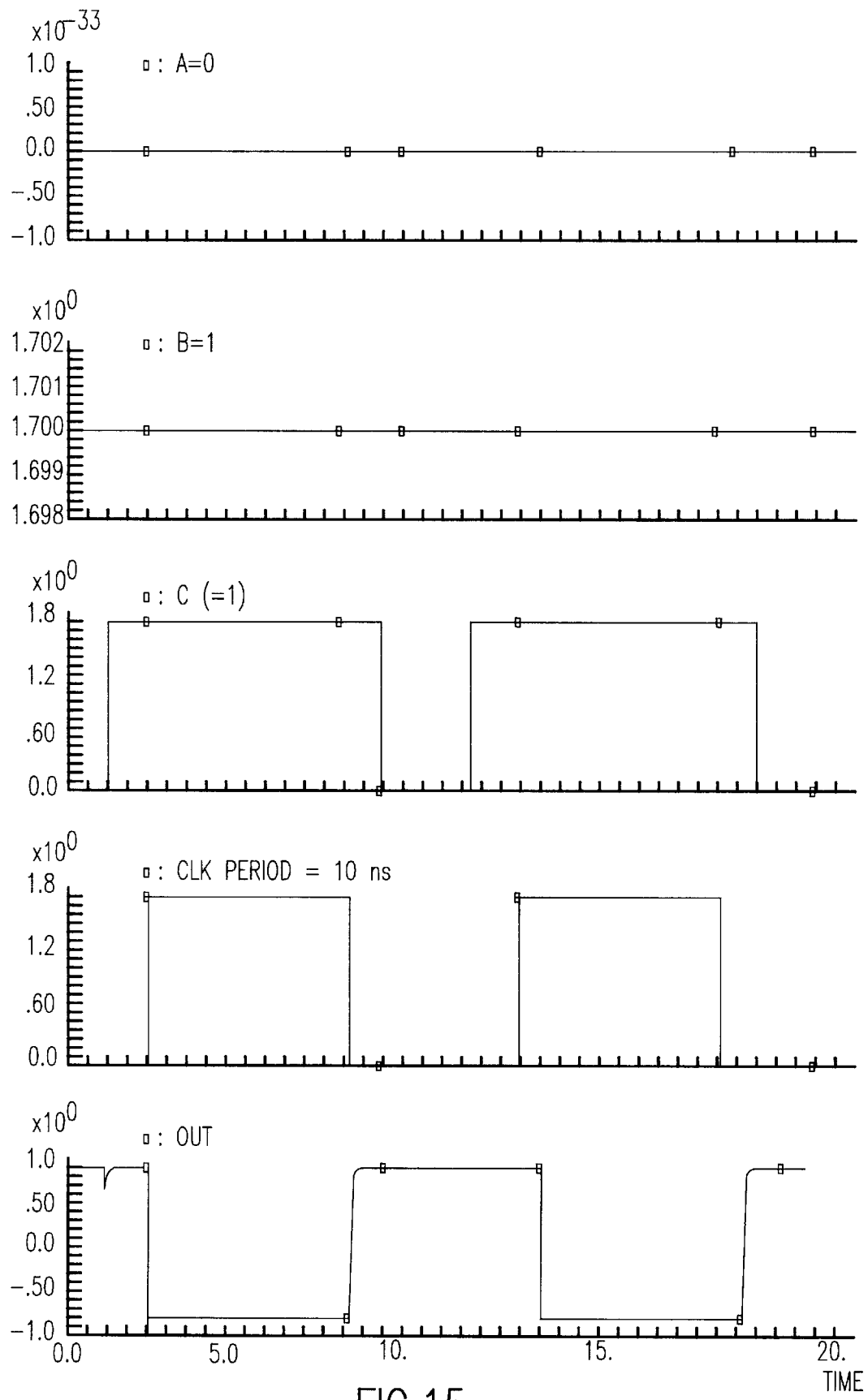
FIG. 15 are waveforms of the dynamic circuit example shown in FIG. 14.
Figure 16:
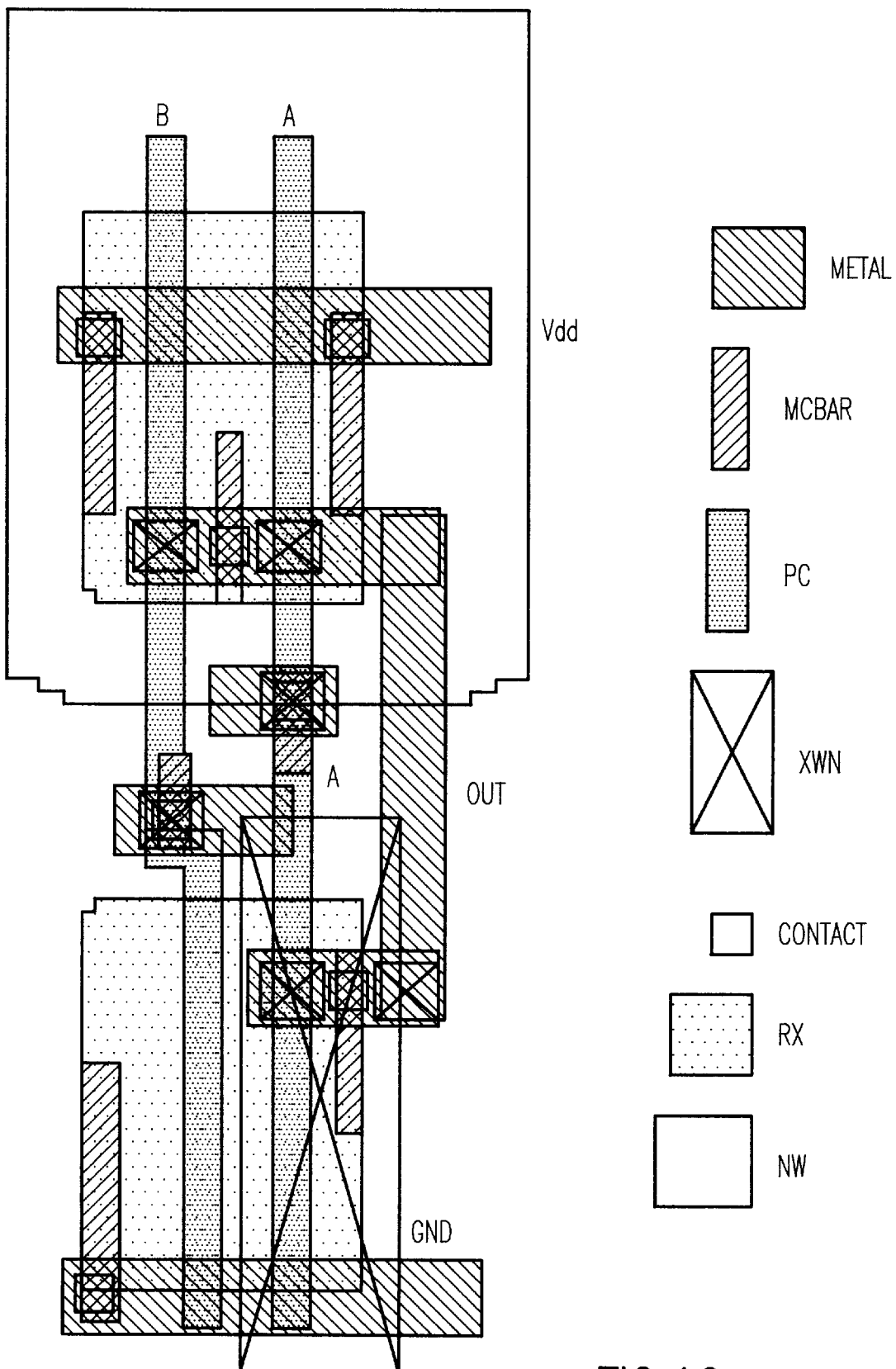
FIG. 16 is a layout example for a two-input NAND gate.
Figure 17:
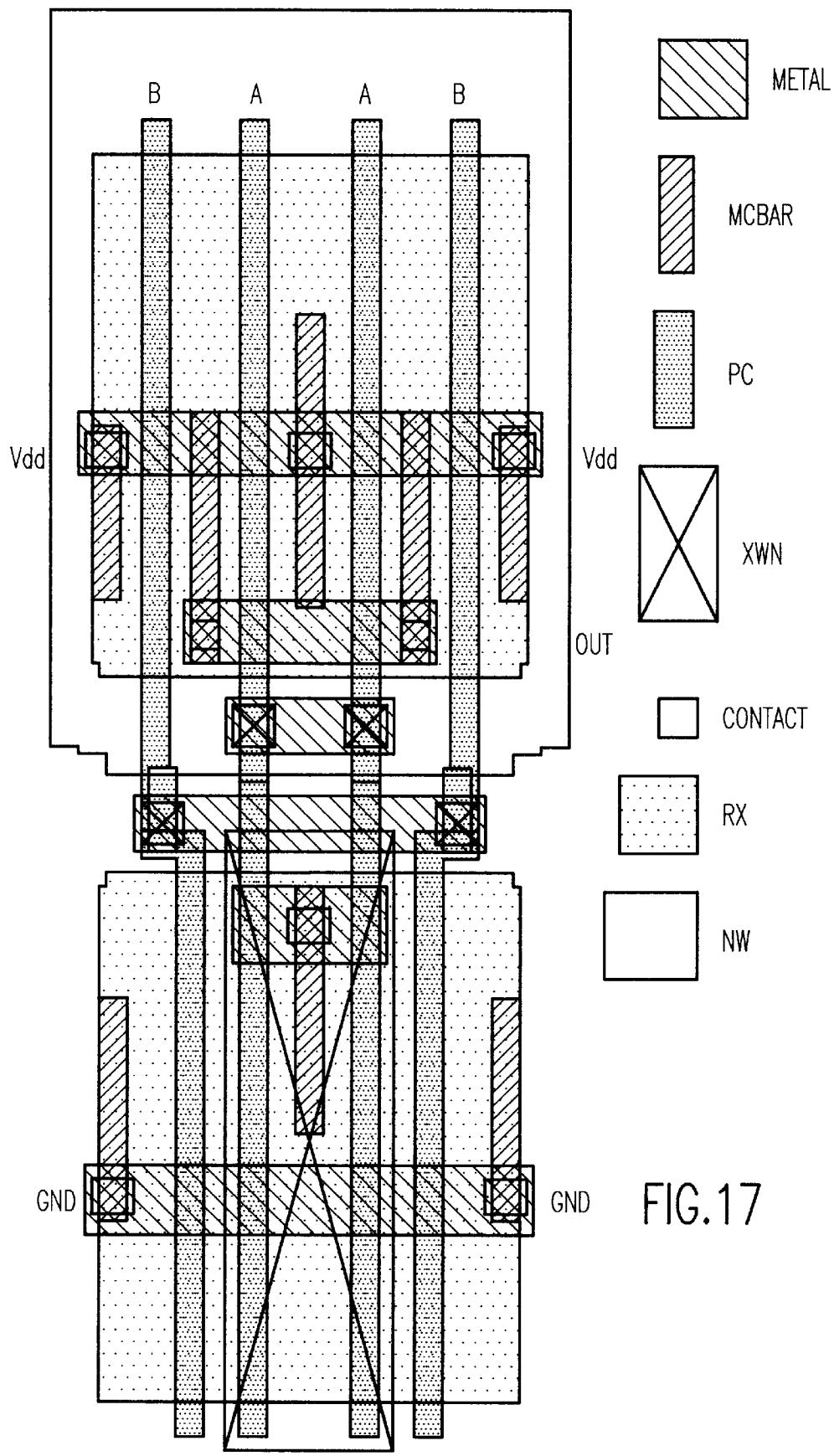
FIG. 17 is a layout example for a two-input NAND gate with two fingers.
Figure 18:
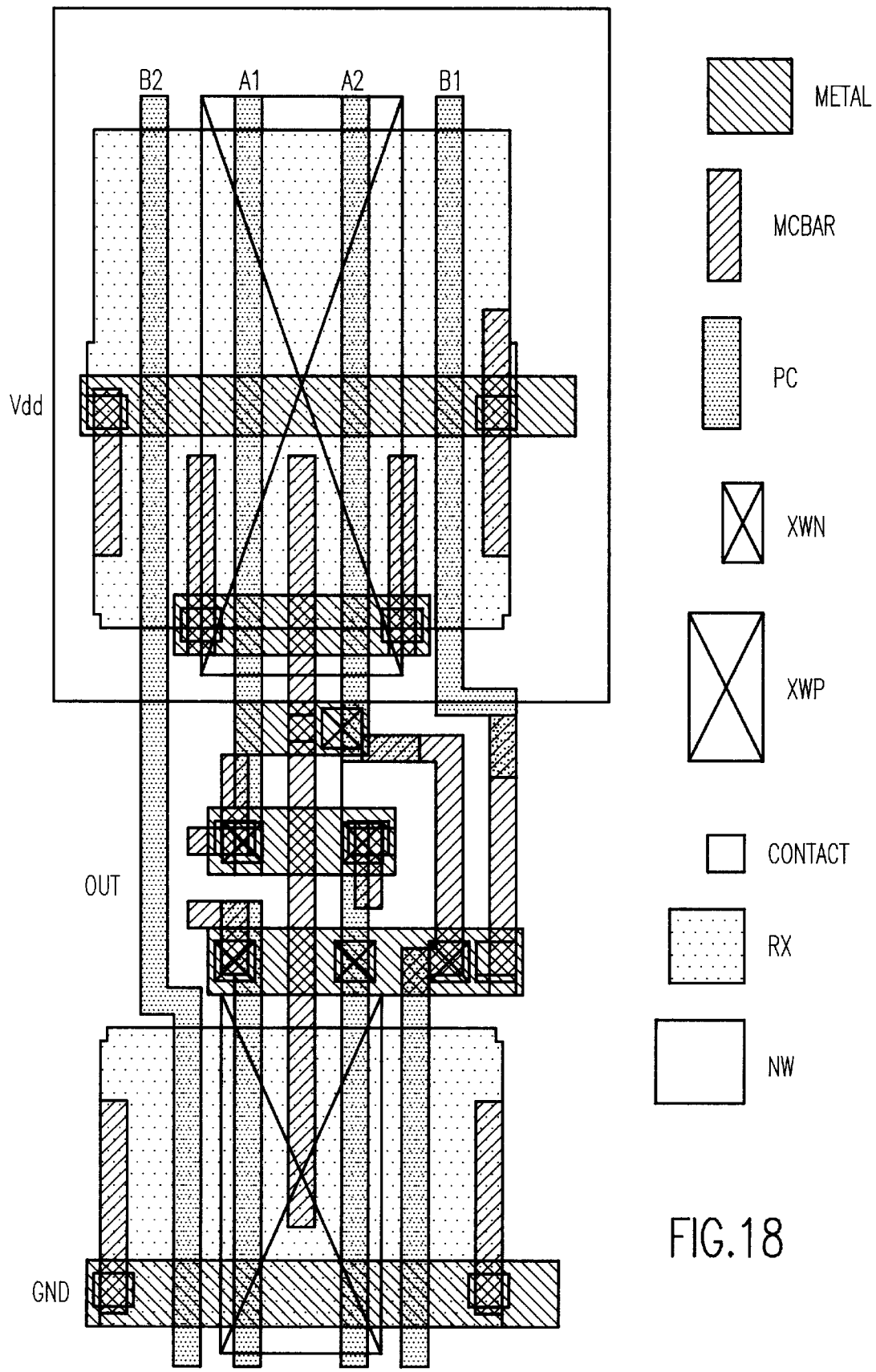
FIG. 18 is a layout example for an AOI logic block.
Figure 19:
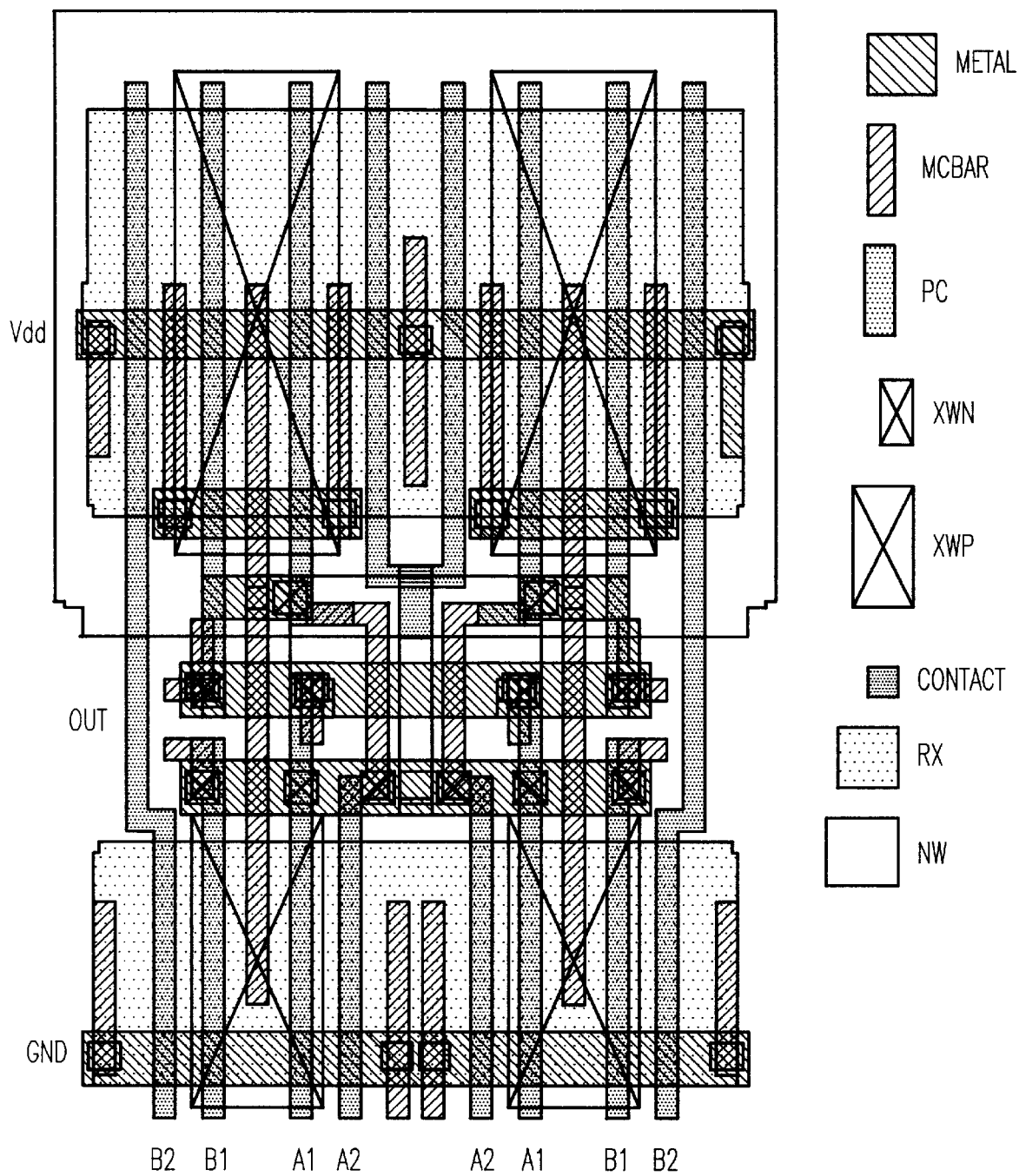
FIG. 19 is a layout example for an AOI logic block with two fingers.

The regular $V_t$ device used for the Clock input serves as a high resistance between $V_{dd}$ and ground. We use low $V_t$ devices for the data logic block to gain speed. The simulation result listed in Table 4 show clearly using mixed $V_t$ approach we can achieve about half of the speed gain of using low $V_t$ approach in a dynamic circuit. Yet the leakage current is five times smaller. Simulation also shows that the charge redistribution effect is still the main consideration in designing appropriately-functioned dynamic circuits, and the leakage current in the data logic block is still small, and the RC constant from this contribution is more than three orders of magnitude higher than the clock period (a few ns). Examples of the transient voltage switching behavior are shown in FIG. 15.

The optimization routine for dynamic circuits resembles the one mentioned above except that now several additional keywords and their associate properties have to be defined. For instance, there are clock group, there are data group, there are feedback group and there are buffer group. One approach is to treat the whole data logic part as a device group so they can be converted to low $V_t$ at the same time. See FIG. 14.

In both dynamic type and the static type, the parasitic capacitance has very large impact on speed. Good layout not only saves silicon real estate but also minimizes parasitics. Layout concerns for the mixed $V_t$ is briefly described below. First of all, no new masks are involved in this mixed $V_t$ approach. It uses exactly the same hardware technology as the low $V_t$ book approach that has been implemented in current technology. A separated channel implant is used for making low $V_t$ devices. The same HALO as in regular $V_t$ devices is implanted in the low $V_t$ device to make sure that the low $V_t$ devices have no worse short channel effects than the regular $V_t$ devices. Careful alignment of the low $V_t$ mask to other masks are crucial for the success of making chips containing mixed low $V_t$ and regular $V_t$ devices in a single logic unit. The current ground rules favors use of multi-finger type of mixed $V_t$ layout and have limitation on stacked devices. But this can be changed as the technology evolves.

A few layout examples are shown in FIGS. 16 to 19 for, respectively, a two input NAND gate, a two input NAND gate with two fingers, an AOI circuit, and an AOI circuit with two fingers. Note the use of XWN and XWP layers for low $V_t$ NFET and low $V_t$ PFET regions. The layout optimization routine basically follows the regular layout optimization routine. Euler graph technique is applied to search all the paths to minimize the number of ROXs. Similar technique is applied to XWN and XWP to minimize the numbers of separate XWNs and XWPs. Minimizing the number of separate XWNs and XWPE can help to improve yield and reduce processing complexity as well as parasitics.

While the invention has been described in terms of preferred embodiments with several examples, those skilled in the art will recognize that the invention can be practiced with modification within the spirit and scope of the appended claims.

Having thus described my invention, what I claim as new and desire to secure by Letters Patent is as follows:

1. Logic books with mixed low $V_t$ and regular $V_t$ devices to provide a performance gain without a large increase in stand-by power wherein, in a path between $V_{dd}$ and ground, there must be at least one regular $V_t$ device serving as high resistance to reduce the leakage current and the low $V_t$ devices become reversely biased in their standby states so as to reduce its leakage current effectively, and wherein in a path between $V_{dd}$ and an output there must be at least one said regular $V_t$ device, wherein said low $V_t$ devices are connected to a node closest to the output, and wherein in a path between the output and ground there must be at least one said regular $V_t$ device, and wherein said regular $V_t$ devices are connected to $V_{dd}$.

2. The logic books with mixed low $V_t$ and regular $V_t$ devices as recited in claim 1 wherein the mixed low $V_t$ and regular $V_t$ devices are metal oxide semiconductor field effect transistors (MOSFETs).

3. The logic books with mixed low $V_t$ and regular $V_t$ devices as recited in claim 2 wherein circuits of the logic books are static circuits.

4. The logic books with mixed low $V_t$ and regular $V_t$ devices as recited in claim 3 wherein one of the circuits is a NAND gate.

5. The logic books with mixed low $V_t$ and regular $V_t$ devices as recited in claim 3 wherein one of the circuits is a NOR gate.

6. The logic books with mixed low $V_t$ and regular $V_t$ devices as recited in claim 4 wherein one of the circuits is an AND-OR-INVERT logic block.

7. The logic books with mixed low $V_t$ and regular $V_t$ devices as recited in claim 3 wherein one of the circuits is an OR-AND-INVERT logic block.

8. The logic books with mixed low $V_t$ and regular $V_t$ devices as recited in claim 3 wherein one of the circuits is an ADDER circuit.

9. The logic books with mixed low $V_t$ and regular $V_t$ devices as recited in claim 3 wherein one of the circuits is a multiplexer circuit.

10. The logic books with mixed low $V_t$ and regular $V_t$ devices as recited in claim 2 wherein circuits of the logic books are dynamic circuits.

* * * * *